United States Patent
Kindred et al.

(10) Patent No.: US 9,635,471 B2
(45) Date of Patent: Apr. 25, 2017

(54) SYSTEMS AND METHODS FOR NEW BATTERY IDENTIFICATION AND DERIVED BATTERY CAPACITY

(71) Applicant: Starkey Laboratories, Inc., Eden Prairie, MN (US)

(72) Inventors: Jon S. Kindred, Minneapolis, MN (US); Mohammed Reza Movahedi, Eden Prairie, MN (US)

(73) Assignee: Starkey Laboratories, Inc, Eden Prairie, MN (US)

( * ) Notice: Subject to any disclaimer, the term of this patent is extended or adjusted under 35 U.S.C. 154(b) by 0 days.

(21) Appl. No.: 14/733,358

(22) Filed: Jun. 8, 2015

(65) Prior Publication Data
US 2016/0360323 A1   Dec. 8, 2016

(51) Int. Cl.
*H04R 25/00* (2006.01)
*G01R 31/36* (2006.01)

(52) U.S. Cl.
CPC ....... *H04R 25/305* (2013.01); *G01R 31/3682* (2013.01); *H04R 2225/31* (2013.01); *H04R 2225/33* (2013.01)

(58) Field of Classification Search
CPC .. H04R 25/30; H04R 25/305; H04R 2225/31; H04R 2225/33; G01R 31/36–31/3696
See application file for complete search history.

(56) References Cited

U.S. PATENT DOCUMENTS

| | | | |
|---|---|---|---|
| 4,849,700 A | 7/1989 | Morioka et al. | |
| 5,032,825 A | 7/1991 | Kuznicki | |
| 5,043,651 A | 8/1991 | Tamura | |
| 5,126,675 A | 6/1992 | Yang | |
| 6,166,548 A | 12/2000 | Winzer et al. | |
| 2003/0069704 A1* | 4/2003 | Bean | G01R 31/3648 702/63 |
| 2013/0070946 A1* | 3/2013 | Kroman | H04R 25/558 381/315 |
| 2013/0259278 A1 | 10/2013 | Kill et al. | |
| 2014/0355781 A1* | 12/2014 | Eckardt | H04R 1/1041 381/74 |

(Continued)

OTHER PUBLICATIONS

"Rayovac Proline Advanced FAQs", [Online]. Retrieved from the Internet: <URL: http://www.thepowerofhearing.com/Resources/FAQs.aspx, (Accessed Oct. 29, 2015), 2 pgs.

(Continued)

*Primary Examiner* — Wayne Young
*Assistant Examiner* — Mark Fischer
(74) *Attorney, Agent, or Firm* — Schwegman, Lundberg & Woessner, P.A.

(57) ABSTRACT

The present subject matter includes systems and methods for detecting a new hearing aid battery and estimating hearing aid battery life by analyzing changes in battery voltage signatures during the hearing aid device booting process. The analysis may include analyzing a boot signature voltage drop occurring upon initial application of a higher load. The analysis may include analyzing a boot signature voltage slope occurring during sustained application of a higher load. The analysis may also include analyzing a boot signature voltage droop occurring throughout application of a lower load and application of a higher load.

20 Claims, 4 Drawing Sheets

(56) References Cited

U.S. PATENT DOCUMENTS

2015/0192643 A1* 7/2015 Barke ................ G01R 31/3637
324/427

OTHER PUBLICATIONS

Callaway, Jr., Edgar H., "Wireless Sensor Networks: Architectures and Protocols", CRC Press, Inc. ISBN:0849318238, (Aug. 26, 2003), 1 page.

"European Application Serial No. 16173594.9, Extended European Search Report mailed Nov. 7, 2016", 9 pgs.

* cited by examiner

SYSTEMS AND METHODS FOR NEW BATTERY IDENTIFICATION AND DERIVED BATTERY CAPACITY

FIELD OF THE INVENTION

This patent application pertains to apparatus and processes for identifying battery state and battery capacity.

BACKGROUND

Mobile devices, such as hearing assistance devices, typically include digital electronics to enhance the user's experience. The power source for many mobile devices is selected to be light and small, yet to provide adequate power for a predictable duration. This is especially true for hearing aids, where the size and weight of the power source have a significant effect on the size and comfort in using the hearing aid.

There is a desire to provide an indication of the remaining battery life for hearing aid batteries. This is especially true because of the widespread use of smartphones or sophisticated hearing aid remotes that can connect wirelessly to hearing aids. However, hearing aid batteries (e.g., zinc-air batteries) exhibit voltage and impedance levels that may remain nearly constant over the majority of the life of the battery. Often the only way to test a hearing aid battery is to attempt to use the hearing aid to determine if the battery is working or dead.

What is needed in the art is an improved method of identifying battery state and battery capacity.

SUMMARY

Disclosed herein, among other things, are methods and apparatus for hearing assistance devices, including but not limited to hearing aids, and in particular to identifying battery state and battery capacity.

This present subject matter is directed to providing a battery life estimate for hearing aids. This battery life estimate includes determining when the battery is a new battery, and includes deriving battery life remaining by counting down from a known battery capacity by monitoring the amount of time in various modes.

This Summary is an overview of some of the teachings of the present application and not intended to be an exclusive or exhaustive treatment of the present subject matter. Further details about the present subject matter are found in the detailed description and appended claims. The scope of the present application is defined by the appended claims and their legal equivalents.

DETAILED DESCRIPTION

The present subject matter includes systems and methods for detecting a new battery by analyzing changes in battery voltage signatures during the hearing aid booting process. The present subject matter also enables estimating battery life by counting down form a known battery capacity. When contrasted with the existing, unreliable method of testing a hearing assistance battery by detecting battery voltage, the present method of providing a robust battery indicator will significantly reduce the inconvenience of the hearing aid user.

Some existing solutions for detecting remaining battery life operate by monitoring battery voltage throughout the life of the battery. For example, lithium-ion batteries used in many portable devices exhibit voltage signatures that drop monotonically as the battery discharges, enabling estimation of remaining battery life by monitoring battery voltage. Existing solutions for detecting remaining battery life do not work well in hearing aid applications because of non-monotonic drop in hearing aid battery voltages, and because of large variations in voltage across batteries, as shown and described below with respect to FIGS. 1-3.

Figure 1:
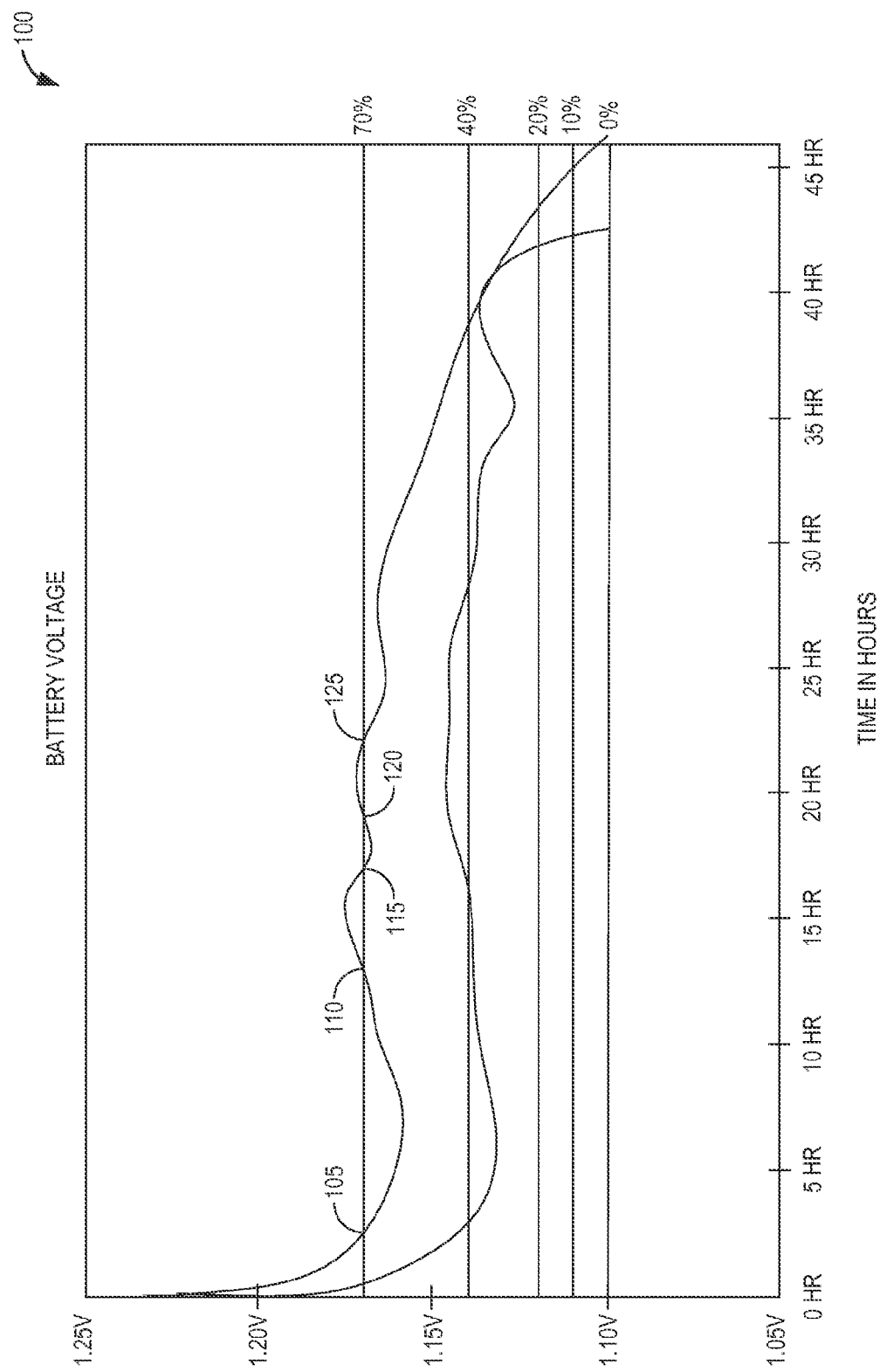
FIG. 1 shows a first example lifetime voltage variation across batteries.

FIG. 1 shows a first example lifetime voltage variation across batteries. FIG. 1 includes voltage signatures of two batteries, such as those used in hearing aid applications. While both batteries are zinc-air batteries, each battery is from a different manufacturer. The two batteries exhibit voltage signatures that are similar at the beginning and near the end of their use, however the voltage signatures differ substantially during the life of the battery. Additionally, these two batteries exhibit voltage signatures that rise or fall at various times throughout the life of the battery, which makes it difficult or impossible to determine the battery life remaining using the voltage level. For example, the uppermost curve crosses 70% at five different locations 105, 110, 115, 120, and 125 within the first twenty-five hours of operation. Because of this non-monotonic decrease in battery voltage, the battery life remaining cannot be determined reliably using the battery voltage level.

Figure 2:
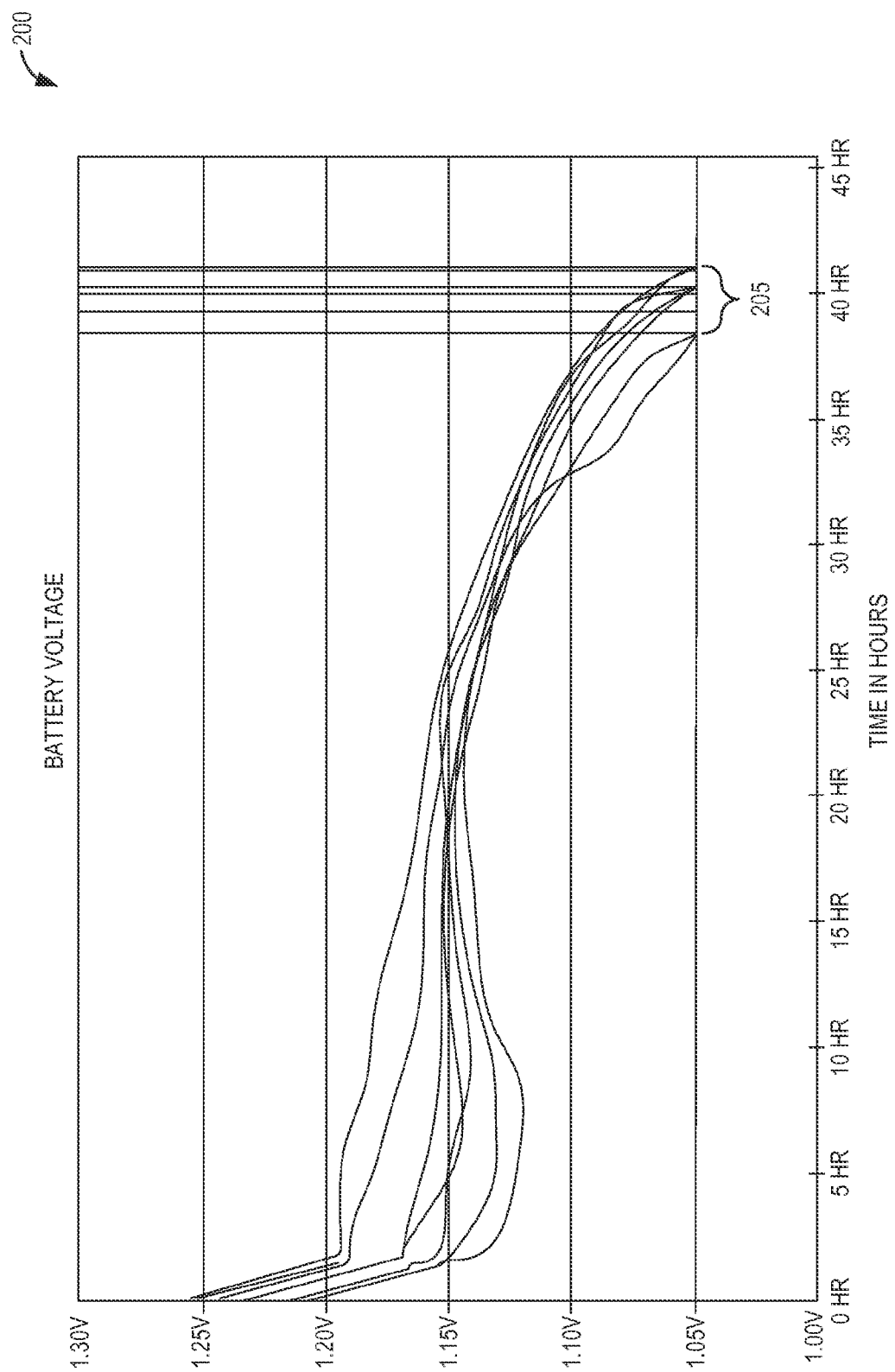
FIG. 2 shows a second example lifetime voltage variation across batteries.

FIG. 2 shows a second example of lifetime voltage variation across batteries. As in FIG. 1, the batteries shown in FIG. 2 are zinc-air batteries from different manufacturers. A 5.5 mA load was applied to each battery, and FIG. 2 shows the substantial variation in voltage signatures over the lifetime of the batteries. Upon reaching the shutdown threshold voltage of 1.05 V, the 5.5 mA load is removed, resulting in a vertical voltage rise shown at 205. Different batteries reach the 1.05 V level at different times, as shown by the width of 205.

Figure 3:
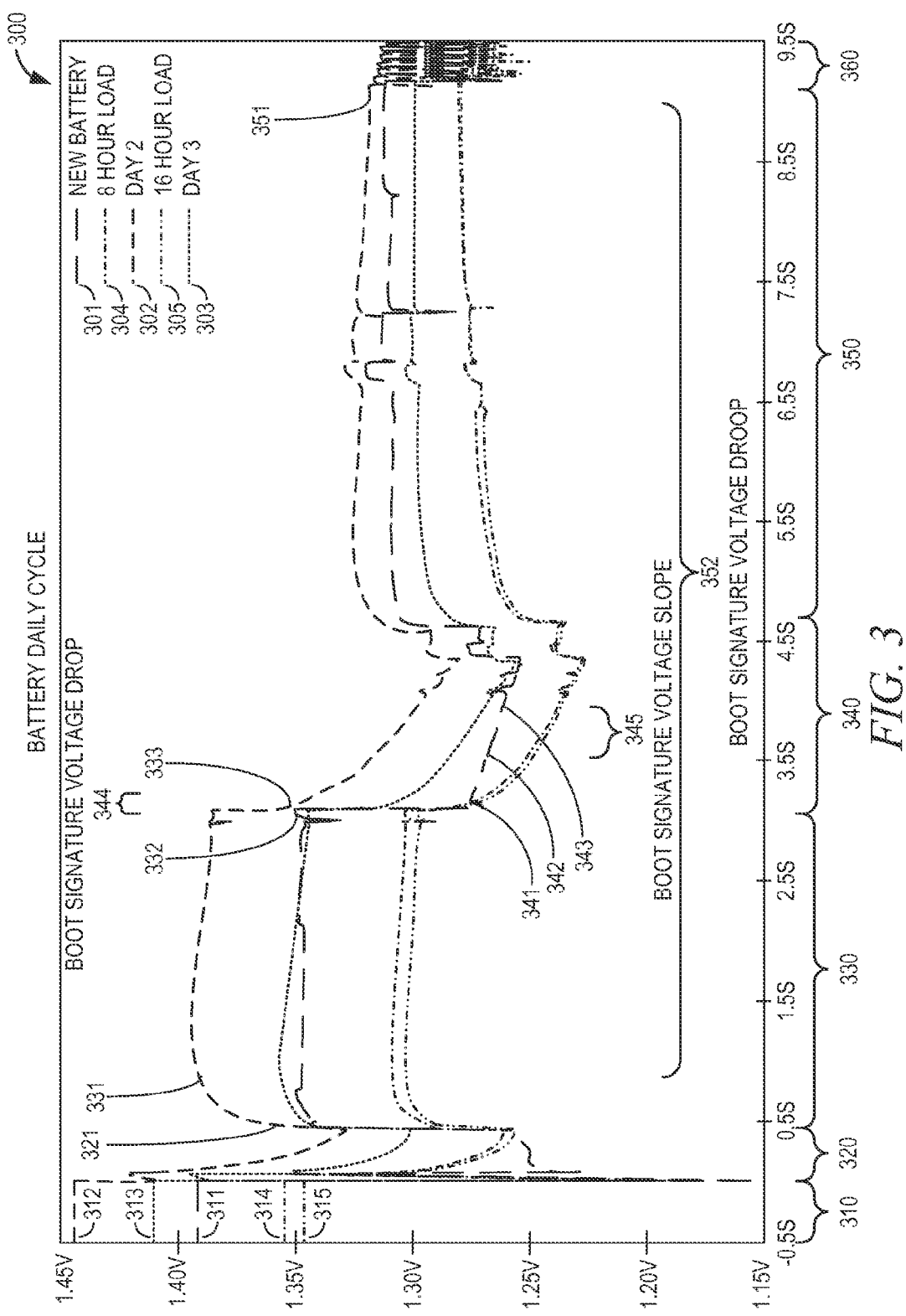
FIG. 3 shows an example battery boot signature.

FIG. 3 shows an example battery boot signature 300. Determination of whether a battery is new includes examining characteristics of various regions within the battery boot signature. The boot signature may be described as a graph of the changing voltage level of the battery during the initial booting process of the hearing aid. The boot signature may be analyzed, where analysis may include recording and analyzing the amount of time the hearing aid spends in various modes of operation, and may include analyzing relative or absolute voltage levels within each mode of operation. The boot signature analysis may be used to identify when a battery is a new battery, and an estimate of battery life remaining may include counting down from a known battery capacity by monitoring the amount of time in various modes. Hearing assistance battery life remaining may be implemented in hardware or software as a counter. This counter may start at a known capacity of a new battery, and subtract from the known capacity as the hearing aid is being used, where the subtraction rate may depend on the current mode of operation of the hearing aid, the hearing aid receiver type, the output level, or other considerations.

Analysis of the boot signature may identify voltage level changes during multiple modes of operation. For example, the boot signature may include a high-power consuming mode, a low-power consuming mode, or other modes. Analysis of the boot signature may identify voltage level changes that are specific to different hearing aid hardware or software types. It is important to note that, while FIG. 3 depicts specific voltage signatures for illustration purposes, the systems and methods described herein do not require detection of absolute voltage signatures, and instead may operate by comparing relative voltage signatures, analyzing voltage level slopes, and by analyzing other characteristics of the voltage signatures. Additionally, though FIG. 3 depicts specific voltage signatures detected in response to a specific series of booting operations with associated voltage and current requirements, a higher or lower current draw may be applied to a battery to help determine if the battery is new or used. In addition to a voltage analysis, characterization of the current draw and other hearing aid receiver radio characteristics during various modes of operation may help determine if the battery is new or used.

FIG. 3 depicts five different voltage signatures corresponding to booting or rebooting a single battery at five different times within its life. For example, the line shown at 301 corresponds to the voltage signatures of the first booting of a new battery at the beginning of the first day of battery use (e.g., day 1). Similarly, the line shown at 302 corresponds to the voltage signatures detected when booting the same battery at the beginning of the second day of battery use (e.g., day 2), and 303 corresponds to voltage signatures detected when booting the same battery at the beginning of the third day of use (e.g., day 3). The line shown at 304 corresponds to the voltage signatures for a battery being rebooted after eight hours of continuous use, and the line shown at 305 corresponds to the voltage signatures for a battery being rebooted at the end of the second day of use after sixteen hours of use.

As shown in FIG. 3, this battery boot signature 300 includes six time intervals of interest within the boot process: 310, 320, 330, 340, 350, and 360. The first time interval 310 occurs before the hearing aid is turned on, and shows the initial voltage level corresponding to each of the five different voltage signatures. For example, voltage level 311 corresponds to the first booting of a new battery (line 301), voltage level 312 corresponds to the second-day booting of the same battery (line 302), voltage level 313 corresponds to the third-day booting of the same battery (line 303), voltage level 314 corresponds to a reboot of the same battery after eight hours of use (line 304), and voltage level 315 corresponds to a reboot of the same battery at the end of the second day (e.g., day 2) and after sixteen hours of use (line 305). Notably, first time interval 310 shows that the initial voltage of the first boot of the new battery 311 is lower than the second-day voltage level 312 or the third-day voltage level 313.

In the second time interval 320, there is a large voltage drop as power is applied to the circuits within the hearing aid. After the circuit completes its power-on process, the voltage signatures exhibit a steep increase at 321.

In the third time interval 330, the digital signal processor (DSP) within the hearing aid initiates a power-on-reset (POR) to halt the radio while the DSP continues through its boot process. In this third time interval 330, used batteries generally have a slightly steeper slope, such as the second-day battery curve shown at 331.

In the fourth time interval 340, the POR has been released, and the radio performs its boot process. The voltage signatures in the third time interval 330 and in the fourth time interval 340 were generated using a DSP boot process and a radio boot process, where the radio boot process in the fourth time interval 340 required a higher current draw (e.g., a higher power load) than the DSP boot process in the third time interval 330. However, another boot signature may be identified by applying different processes that apply a relatively lower power load in third time interval 330 and apply a relatively higher power load in the fourth time interval 340.

Within this fourth time interval 340, new batteries have a steeper initial voltage drop, and have a shallower slope in the middle region. Also within this fourth time interval 340, rested batteries (e.g., used batteries) exhibit a larger overall drop in voltage level. The boot signature voltage drop 344 is shown as the difference between 332 and 341. If this boot signature voltage drop 344 is far enough, the battery may be identified to be a new battery. Similarly, the boot signature voltage slope 345 is shown as the slope between 342 and 343. If this boot signature voltage slope 345 is shallow enough, the battery may be identified to be a new battery.

In the fifth time interval 350, the voltage levels recover after the radio has completed its boot process. The fifth time interval includes some voltage level fluctuations due to minor hearing aid operations. The boot signature voltage droop 352 is shown as the voltage change between 331 and 351. If this boot signature voltage droop 352 is large enough, the battery may be identified to be a battery that has been resting, and may not be identified to be a new battery. This boot signature voltage droop 352 may be used in conjunction with the boot signature voltage drop 344 to identify a battery as a used battery. This boot signature voltage droop 352 may be tested again against a different voltage change threshold to identify used batteries.

In the sixth time interval 360, a series of activities were performed by the radio, however the voltage level variations during this sixth time interval 360 did not vary significantly among new and rested batteries.

Figure 4:
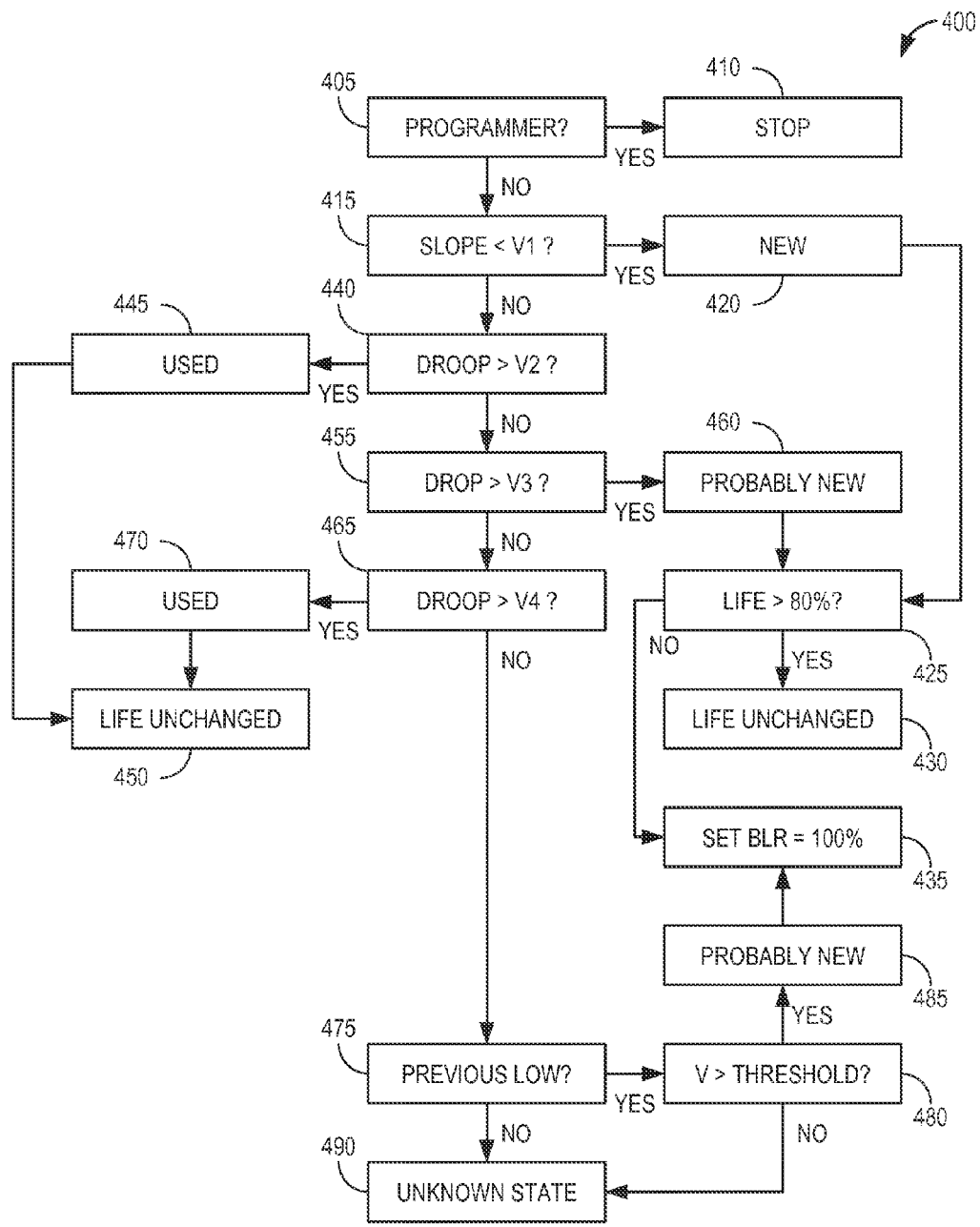
FIG. 4 shows a flow chart of an example battery life determination.

FIG. 4 shows a flow chart of an example battery life determination. Generally, if a new battery is detected when the hearing aid is powered on, a battery life remaining (BLR) indicator may be reset to indicate the battery is new, and an estimate of battery life remaining may be generated by counting down from a known battery capacity by monitoring the amount of time in various modes. Conversely, if a new battery is not detected, the BLR indicator is unchanged. It is important to note that, while FIG. 4 uses terms to represent voltage levels for illustration purposes (e.g., V1, V2, V3, V4), the systems and methods described herein do not require detection of absolute voltage levels, and instead may operate by comparing relative voltage levels, by comparing voltage level slopes, or by comparing other characteristics of the voltage signatures.

Method 400 may begin by detecting 405 whether the hearing aid is connected to a hearing aid programmer. Because being connected to a hearing aid programmer will significantly change the battery boot time intervals and battery voltage signatures, detection 405 of the programmer will result in the method stopping 410.

At step 415, the boot signature voltage slope 345 may be examined, where the boot signature voltage slope 345 is shown in FIG. 3 as the slope between 342 and 343. The boot signature voltage slope 345 may be tested against threshold V1 over the corresponding time interval. If the slope is less than threshold V1, the battery will be marked 420 as a new battery, and the BLR indicator will be examined 425. If the BLR examination 425 indicates the battery life remaining is above 80%, the BLR remaining will be unchanged 430. If the BLR examination 425 indicates the battery life remaining is below 80%, the BLR remaining will be reset 435 to 100%, and a new battery indicator may be reset. After BLR remaining is reset 435 to 100%, BLR may be updated by counting down from 100% by monitoring the amount of time in various modes. If the slope is not less than the threshold, method 400 may proceed to step 440.

At step 440, the boot signature voltage droop 352 may be examined, where the boot signature voltage droop 352 is shown in FIG. 3 as the voltage change between 331 and 351. The boot signature voltage droop 352 may be tested against threshold V2 over the corresponding time interval. If the droop is greater than threshold V2, then the battery may be identified 445 to be a used battery. Additionally, the BLR is left unchanged 450, as the BLR is difficult to determine without additional information regarding whether the battery has been changed or not. For example, while a used battery likely corresponds to a hearing aid battery that has not been changed since its initial installation, a used battery may also correspond to a different battery that has been resting. If the droop is not greater than the threshold, method 400 may proceed to step 455.

At step 455, the boot signature voltage drop 344 may be examined, where the boot signature voltage drop 344 is shown in FIG. 3 as the voltage change between 332 and 341. The boot signature voltage drop 344 may be tested against threshold V3. If the drop is greater than threshold V3, then the battery may be identified 460 to be a new battery, and the BLR indicator will be examined 425. If the BLR examination 425 indicates the battery life remaining is above 80%, the BLR remaining will be unchanged 430. If the BLR examination 425 indicates the battery life remaining is below 80%, the BLR remaining will be reset 435 to 100%, and a new battery indicator may be reset. After BLR remaining is reset 435 to 100%, BLR may be updated by counting down from 100% by monitoring the amount of time in various modes. If the drop is not greater than the threshold, method 400 may proceed to step 465.

At step 465, the boot signature voltage droop 352 may be reexamined. The boot signature voltage droop 352 may be compared against threshold V4 over the corresponding time interval. If the droop is greater than threshold V4, then the battery may be identified 470 to be a used battery. Additionally, the BLR is left unchanged 450, as the BLR is difficult to determine without additional information regarding whether the battery has been changed or not. If the droop is not greater than the threshold, method 400 may proceed to step 475.

At step 475, a low battery indicator may be examined. The low battery indicator may have been set during a previous use of the hearing aid to indicate the battery voltage previously fell below a low battery warning threshold. If a previous low battery indicator is detected, the battery voltage level may be tested against the low battery warning threshold. If the battery voltage level is above the low battery warning threshold, the battery may be identified 485 to be a new battery, and the BLR remaining may be reset 435 to 100% and a new battery indicator may be reset. After BLR remaining is reset 435 to 100%, BLR may be updated by counting down from 100% by monitoring the amount of time in various modes. If the threshold examination 480 indicates the battery voltage level is not above the low battery warning threshold, or if the previous low battery examination 475 indicates no previous low battery indicator was detected, the battery may be identified 490 to be associated with an unknown state.

These systems and methods may also enable detection of the application of this battery life indicator. For example, by inserting a battery of a known charge or by simulating a series of voltages, observation of the battery life indicator could indicate whether the hearing aid is using the systems and methods described herein.

It is understood that in various embodiments, the apparatus and processes set forth herein may be embodied in digital hardware, analog hardware, and/or combinations thereof. It is also understood that in various embodiments, the apparatus and processes set forth herein may be embodied in hardware, software, firmware, and/or combinations thereof.

The present subject matter is demonstrated for hearing assistance devices, such as hearing aids. These hearing assistance devices may include behind-the-ear (BTE) devices, receiver-in-canal (RIC) devices, completely-in-the-canal (CIC) devices, in-the-ear (ITE) devices, in-the-canal (ITC) devices, or other hearing assistance devices. It is understood that BTE devices may include devices that reside substantially behind the ear or over the ear. Such devices may include hearing aids with receivers associated with the electronics portion of the BTE device, or hearing aids of the type having receivers in the ear canal of the user, including but not limited to RIC or receiver-in-the-ear (RITE) designs. The present subject matter can also be used with wired or wireless ear bud devices. The present subject matter can also be used in hearing assistance devices generally, such as cochlear implant-type hearing devices and such as deep insertion devices having a transducer, such as a receiver or microphone, whether custom fitted, standard, open fitted, or occlusive fitted. It is understood that other hearing assistance devices not expressly stated herein may be used in conjunction with the present subject matter.

The present disclosure supports several examples, including but not limited to the following:

Example 1 includes a method for identifying hearing aid battery state, the method comprising executing a boot sequence on a hearing aid, detecting a battery voltage signature during one or more portions of the boot sequence, each portion of the boot sequence having an associated battery load sequence, determining one or more voltage signature characteristics within the battery voltage signature, and identifying a hearing aid battery state for a hearing aid battery based on the one or more voltage signature characteristics.

Example 2 includes the method of example 1, wherein identifying the hearing aid battery state includes comparing the one or more voltage signature characteristics against one or more voltage signature characteristic thresholds.

Example 3 includes the method any of examples 1-2, wherein the boot sequence includes a high battery load portion, determining the one or more voltage signature characteristics includes determining a boot signature voltage slope based on the high battery load portion of the boot sequence.

Example 4 includes the method of any of examples 1-3, wherein identifying the hearing aid battery state includes comparing the boot signature voltage slope to a slope threshold, determining the boot signature voltage slope is below the slope threshold, and identifying the hearing aid battery as a new battery.

Example 5 includes the method of any of examples 1-2, wherein the boot sequence further includes a low battery load portion and an operational portion, and determining the one or more voltage signature characteristics further includes determining a boot signature voltage droop based on a voltage droop difference between the low battery load portion and the operational portion.

Example 6 includes the method of any of examples 1-5, wherein identifying the hearing aid battery state includes comparing the boot signature voltage droop to a droop threshold, determining the boot signature voltage droop is above the droop threshold, and identifying the hearing aid battery as a used battery.

Example 7 includes the method of any of examples 1-2, wherein determining the one or more voltage signature characteristics further includes determining a boot signature voltage drop based on a voltage drop difference between a low battery load voltage and a high battery load voltage.

Example 8 includes the method of any of examples 1-7, wherein identifying the hearing aid battery state includes comparing the boot signature voltage drop to a drop threshold, determining the boot signature voltage drop is above the drop threshold, and identifying the hearing aid battery as a new battery.

Example 9 includes the method of any of examples 1-7, wherein identifying the hearing aid battery state includes comparing the boot signature voltage droop to a secondary droop threshold, determining the boot signature voltage droop is above the secondary droop threshold, and identifying the hearing aid battery as a used battery.

Example 10 includes the method of any of examples 1-7, wherein identifying the hearing aid battery state includes comparing the boot signature voltage droop to the secondary droop threshold, determining the boot signature voltage droop is not above the secondary droop threshold, determining that a low voltage indicator was previously set, determining that a present voltage is above a low voltage threshold, and identifying the hearing aid battery as a new battery.

Example 11 includes the method of example 1, further including detecting a hearing aid operation state, the hearing aid operation state corresponding to an estimated battery life decrease, and generating an estimated battery life remaining by subtracting the estimated battery life decrease from a first estimated battery life remaining value.

Example 12 includes a hearing aid apparatus, the apparatus comprising a digital signal processor (DSP), a radio, a battery, and a processor, the processor configured to execute a boot sequence on a hearing aid, detect a battery voltage signature during one or more portions of the boot sequence, each portion of the boot sequence having an associated battery load sequence, determine one or more voltage signature characteristics within the battery voltage signature, and identify a hearing aid battery state for a hearing aid battery based on the one or more voltage signature characteristics.

Example 13 includes the apparatus of example 12, wherein identifying the hearing aid battery state includes the processor being further configured to compare the one or more voltage signature characteristics against one or more voltage signature characteristic thresholds.

Example 14 includes the apparatus of any of examples 12-13, wherein the boot sequence includes a high battery load portion, and the processor is further configured to determine a boot signature voltage slope based on the high battery load portion of the boot sequence.

Example 15 includes the apparatus of any of examples 12-14, wherein the processor is further configured to compare the boot signature voltage slope to a slope threshold, determine the boot signature voltage slope is below the slope threshold, and identify the hearing aid battery as a new battery.

Example 16 includes the apparatus of any of examples 12-13, wherein the boot sequence further includes a low battery load portion and an operational portion, and the processor is further configured to determine a boot signature voltage droop based on a voltage droop difference between the low battery load portion and the operational portion.

Example 17 includes the apparatus of any of examples 12-16, wherein the processor is further configured to compare the boot signature voltage droop to a droop threshold, determine the boot signature voltage droop is above the droop threshold, and identify the hearing aid battery as a used battery.

Example 18 includes the apparatus of any of examples 12-12, wherein the processor is further configured to determine a boot signature voltage drop based on a voltage drop difference between a low battery load voltage and a high battery load voltage.

Example 19 includes the apparatus of any of examples 12-18, wherein the processor is further configured to compare the boot signature voltage drop to a drop threshold, determine the boot signature voltage drop is above the drop threshold, and identify the hearing aid battery as a new battery.

Example 20 includes the apparatus of any of examples 12-19, wherein the processor is further configured to compare the boot signature voltage droop to a secondary droop threshold, determine the boot signature voltage droop is above the secondary droop threshold, and identify the hearing aid battery as a used battery.

Example 21 includes the apparatus of any of examples 12-21, wherein the processor is further configured to compare the boot signature voltage droop to the secondary droop threshold, determine the boot signature voltage droop is not above the secondary droop threshold, determine that a low voltage indicator was previously set, determine that a present voltage is above a low voltage threshold, and identify the hearing aid battery as a new battery.

Example 22 includes the apparatus of any of examples 12-11, wherein the processor is further configured to detect a hearing aid operation state, the hearing aid operation state corresponding to an estimated battery life decrease, and generate an estimated battery life remaining by subtracting the estimated battery life decrease from a first estimated battery life remaining value.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

The preceding detailed description of the present subject matter refers to subject matter in the accompanying drawings that show, by way of illustration, specific aspects and embodiments in which the present subject matter may be practiced. These embodiments are described in sufficient detail to enable those skilled in the art to practice the present subject matter. References to "an," "one," or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

What is claimed is:

1. A method for identifying a hearing aid battery state, the method comprising:
 executing a boot sequence on a hearing aid;
 detecting a plurality of battery voltage measurements during the boot sequence;
 determining a boot signature voltage slope based on the plurality of battery voltage measurements; and
 identifying the hearing aid battery state for a hearing aid battery based on the boot signature voltage slope.

2. The method of claim 1, further including:
 executing a high battery load boot sequence;
 wherein determining the boot signature voltage slope is further based on the high battery load boot sequence.

3. The method of claim 2, wherein identifying the hearing aid battery state includes:
 comparing the boot signature voltage slope to a slope threshold;
 determining the boot signature voltage slope is below the slope threshold; and
 identifying the hearing aid battery as a new battery.

4. The method of claim 1, further including:
 executing a low battery load boot sequence and an operational boot sequence; and
 determining a boot signature voltage droop based on a voltage droop difference between the low battery load boot sequence and the operational boot sequence.

5. The method of claim 4, wherein identifying the hearing aid battery state includes:
 comparing the boot signature voltage droop to a first droop threshold;
 determining the boot signature voltage droop is above the first droop threshold; and
 identifying the hearing aid battery as a used battery.

6. The method of claim 4, further including determining a boot signature voltage drop based on a voltage drop difference between a low battery load voltage and a high battery load voltage.

7. The method of claim 6, wherein identifying the hearing aid battery state includes:
 comparing the boot signature voltage drop to a drop threshold;
 determining the boot signature voltage drop is above the drop threshold; and
 identifying the hearing aid battery as a new battery.

8. The method of claim 6, wherein identifying the hearing aid battery state includes:
 comparing the boot signature voltage droop to a second droop threshold;
 determining the boot signature voltage droop is above the second droop threshold; and
 identifying the hearing aid battery as a used battery.

9. The method of claim 6, wherein identifying the hearing aid battery state includes:
 comparing the boot signature voltage droop to a third droop threshold;
 determining the boot signature voltage droop is not above the third droop threshold;
 determining that a low voltage indicator was previously set;
 determining that a present voltage is above a low voltage threshold; and
 identifying the hearing aid battery as a new battery.

10. The method of claim 1, further including:
 detecting a hearing aid operation state, the hearing aid operation state corresponding to an estimated decreased battery life;
 obtaining a first estimated remaining battery life; and
 generating an estimated remaining battery life by subtracting the estimated decreased battery life from the first estimated remaining battery life.

11. A hearing aid apparatus, the apparatus comprising:
 a radio;
 a hearing aid battery; and
 a processor, the processor configured to:
  execute a boot sequence on a hearing aid;
  detect a plurality of battery voltage measurements during the boot sequence;
  determine a boot signature voltage slope based on the plurality of battery voltage measurements; and
  identify a hearing aid battery state for the hearing aid battery based on the boot signature voltage slope.

12. The apparatus of claim 11, wherein:
 the processor being further configured to determine a boot signature voltage slope based on a high battery load boot sequence.

13. The apparatus of claim 12, the processor being further configured to:
 compare the boot signature voltage slope to a slope threshold;
 determine the boot signature voltage slope is below the slope threshold; and
 identify the hearing aid battery as a new battery.

14. The apparatus of claim 11, the processor being further configured to:
 execute a low battery load boot sequence and an operational boot sequence; and
 determine a boot signature voltage droop based on a voltage droop difference between the low battery load boot sequence and the operational boot sequence.

15. The apparatus of claim 14, the processor being further configured to:
 compare the boot signature voltage droop to a first droop threshold;
 determine the boot signature voltage droop is above the first droop threshold; and
 identify the hearing aid battery as a used battery.

16. The apparatus of claim 14, the processor being further configured to determine a boot signature voltage drop based on a voltage drop difference between a low battery load voltage and a high battery load voltage.

17. The apparatus of claim 16, the processor being further configured to:
 compare the boot signature voltage drop to a drop threshold;
 determine the boot signature voltage drop is above the drop threshold; and
 identify the hearing aid battery as a new battery.

18. The apparatus of claim 17, the processor being further configured to:
 compare the boot signature voltage droop to a second droop threshold;
 determine the boot signature voltage droop is above the second droop threshold; and
 identify the hearing aid battery as a used battery.

19. The apparatus of claim 18, the processor being further configured to:
 compare the boot signature voltage droop to a third droop threshold;
 determine the boot signature voltage droop is not above the third droop threshold;
 determine that a low voltage indicator was previously set;
 determine that a present voltage is above a low voltage threshold; and
 identify the hearing aid battery as a new battery.

20. The apparatus of claim 11, the processor being further configured to:
- detect a hearing aid operation state; the hearing aid operation state corresponding to an estimated decreased battery life;
- obtain a first estimated remaining battery life; and
- generate an estimated remaining battery life by subtracting the estimated decreased battery life from the first estimated remaining battery life.

* * * * *